(12) United States Patent
Cho et al.

(10) Patent No.: US 7,704,846 B2
(45) Date of Patent: Apr. 27, 2010

(54) SUBSTRATE EMBEDDED WITH PASSIVE DEVICE

(75) Inventors: Seung-Hyun Cho, Seoul (KR); Il-Soung Yoon, Yongin (KR); Won-Cheol Bae, Suwon (KR); Se-Jong Oh, Ansan-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 205 days.

(21) Appl. No.: 11/546,358

(22) Filed: Oct. 12, 2006

(65) Prior Publication Data

US 2007/0087512 A1     Apr. 19, 2007

(30) Foreign Application Priority Data

Oct. 17, 2005    (KR)    ...................... 10-2005-0097644

(51) Int. Cl.
    *H01L 21/20* (2006.01)
(52) U.S. Cl. ........................ 438/381; 257/378; 257/783; 438/106
(58) Field of Classification Search ............... 361/321.4, 361/321.6; 257/783; 438/381
    See application file for complete search history.

(56) References Cited

U.S. PATENT DOCUMENTS

| 3,235,939 | A | * | 2/1966 | Rodriguez et al. | ......... | 29/25.42 |
| 6,137,063 | A | * | 10/2000 | Jiang | ......................... | 174/261 |
| 6,335,301 | B1 | * | 1/2002 | Kikuchi et al. | .............. | 501/136 |
| 6,740,411 | B2 | * | 5/2004 | Kojima et al. | ............... | 428/413 |
| 6,908,784 | B1 | * | 6/2005 | Farnworth et al. | .......... | 438/106 |
| 6,919,508 | B2 | * | 7/2005 | Forcier | ........................ | 174/565 |
| 2005/0042805 | A1 | * | 2/2005 | Swenson et al. | ............ | 438/113 |
| 2006/0118931 | A1 | * | 6/2006 | Ho et al. | ..................... | 257/678 |

FOREIGN PATENT DOCUMENTS

| JP | 2001-7531 | 1/2000 |
| JP | 2001-237363 | 8/2001 |
| JP | 2002-151846 | 5/2002 |
| KR | 2001-0075628 | 8/2001 |

OTHER PUBLICATIONS

Korean Office Action, dated Aug. 29, 2006, and issued in priority Korean Application No. 2005-97644.

* cited by examiner

*Primary Examiner*—Thanh V Pham
*Assistant Examiner*—Caleb Henry

(57) ABSTRACT

A method for manufacturing a substrate embedded with a passive device, comprising the steps of (a) molding the passive device and (b) mounting the molded passive device in a cavity formed on the substrate, is disclosed. The substrate embedded with a passive device and the manufacturing method thereof in accordance with the present invention can prevent warpage of the substrate caused by disproportioned properties of materials.

7 Claims, 6 Drawing Sheets

500

SUBSTRATE EMBEDDED WITH PASSIVE DEVICE

BACKGROUND OF THE INVENTION

1. Field of the Invention

The present invention is directed to a substrate and a manufacturing method thereof, more specifically to a substrate embedded with a passive device and a method for manufacturing the substrate.

2. Description of the Related Art

Today, packaging substrates are required to improve their performance to keep up with the rapid improvement of performance of semiconductors. Printed circuit boards must essentially be denser, faster and smaller. In the areas of integrated parts, such as semiconductors and thin film devices, particularly, there is heavy research to address these needs. There has been increased demand for high-density recording as well in the area of recording medium such as the magnetic recording head.

The demand for multi-function, high-performance electronic devices necessitates the development of high-density printed circuit boards. Consequently, the demand for printed circuit boards, in which high-density packing is capable, is rapidly increasing in order to satisfy this requirement. Packing an MLCC, for example, can make the printed circuit board much thinner and the surface area much more useful, thereby realizing a higher-density printed circuit board. However, there are a number of technical obstacles in packing this kind of electronic part. It is important to secure the reliability of an electronic part during the packing process and the thermal deformation of a printed circuit board. Inhibiting the warpage of a printed circuit board, in which a hole for packing an electronic part is made, is particularly important for securing the reliability of the electronic part as well as increasing the productivity of the printed circuit board.

Moreover, the parts can be installed in the substrate in order to create space for packing highly-integrated parts. Among the parts installed in the substrate, passive devices such as the capacitor can hold a constant voltage momentarily and consequently maintain a signal formed in the circuit without distorting the signal.

FIG. 1 is a diagram showing a substrate embedded with a multilayer ceramic condenser, in accordance with the prior art. Illustrated in FIG. 1 are a core substrate 30, a through hole 32, tapers 32a, a UV tape 40, an IC chip 20, die pads 22, transition layers 38, filler 41 and press plates 100A and 100B.

A cavity is formed by drilling or laser-processing a copper clad laminate or a pre-preg such that an electronic part can be packed. The electronic part is fixed with a conductive adhesive on a copper coil and then is inserted in the copper clad laminate or pre-preg. With this method, it is not easy to prevent the warpage of the substrate and secure the reliability of the packed chip because the core material of the copper clad laminate is an epoxy type, which can cause warpage by the difference in stiffness and thermal expansion coefficient with the adhesive injected for fixing the chip. This kind of substrate warpage may apply mechanical pressure on the packed MLCC, and cause a reliability problem of the MLCC.

SUMMARY OF CERTAIN INVENTIVE ASPECTS

The present invention provides a substrate embedded with a passive device and a manufacturing method thereof that can prevent warpage of a substrate caused by disproportioned properties of materials.

The present invention also provides a substrate embedded with a passive device and a manufacturing method thereof in which the embedded passive device is not affected by the substrate warpage.

Moreover, the present invention provides a substrate embedded with a passive device and a manufacturing method thereof that can protect the passive device, if the passive device is packed in the substrate, by pre-molding the passive device.

Other technical objects of the present invention shall be easily understood through the following description.

An aspect of the present invention can feature a method for manufacturing a substrate embedded with a passive device, comprising the steps of (a) molding the passive device and (b) mounting the molded passive device in a cavity formed on the substrate.

In the method in accordance with the present invention, the step (a) can further comprise the steps of: (c) forming a patterned circuit on an insulating layer in accordance with an electrode formed on the passive device; (d) laminating a conductive material on the circuit; (e) mounting at least one passive device on the conductive material; (f) removing the insulating layer; (g) molding the passive device; and (h) separating the molded passive device.

Here, the passive device can be any one from a group consisting of a resistance, an inductor and a condenser.

The condenser can be a multilayer ceramic condenser.

The conductive material can be an anisotropic conductive film or an anisotropic conductive paste.

The material molding the passive device in the step (g) can be an epoxy resin.

In the step (h), the molded passive device can be separated in a hexahedral shape, using a saw.

In the step (h), the molded passive device can be separated in a cylindrical shape.

The method of manufacturing a substrate embedded with a passive device in accordance with the present invention can further comprise the steps of: (i) forming a cavity, the cut-section of which has a circular shape, on the substrate, using a drill; and (j) laminating a conductive material on the cavity. The steps (i) and (j) can precede the step (b).

Another aspect of the present invention features a substrate embedded with a passive device. The substrate can comprise: a substrate, on which a cavity is formed; a passive device in the cavity, the passive being pre-molded; and a conductive material for adhering the passive device to the cavity. The conductive material is laminated on the cavity.

The passive device can be any one from a group consisting of a resistance, an inductor and a condenser.

The condenser can be a multilayer ceramic condenser.

The conductive material can be an anisotropic conductive film or an anisotropic conductive paste.

The material molding the passive device can be an epoxy resin.

BRIEF DESCRIPTION OF THE DRAWINGS

These and other features, aspects, and advantages of the present invention will become better understood with regard to the following description, appended claims, and accompanying drawings where:

DETAILED DESCRIPTION OF CERTAIN INVENTIVE EMBODIMENTS

Figure 1:
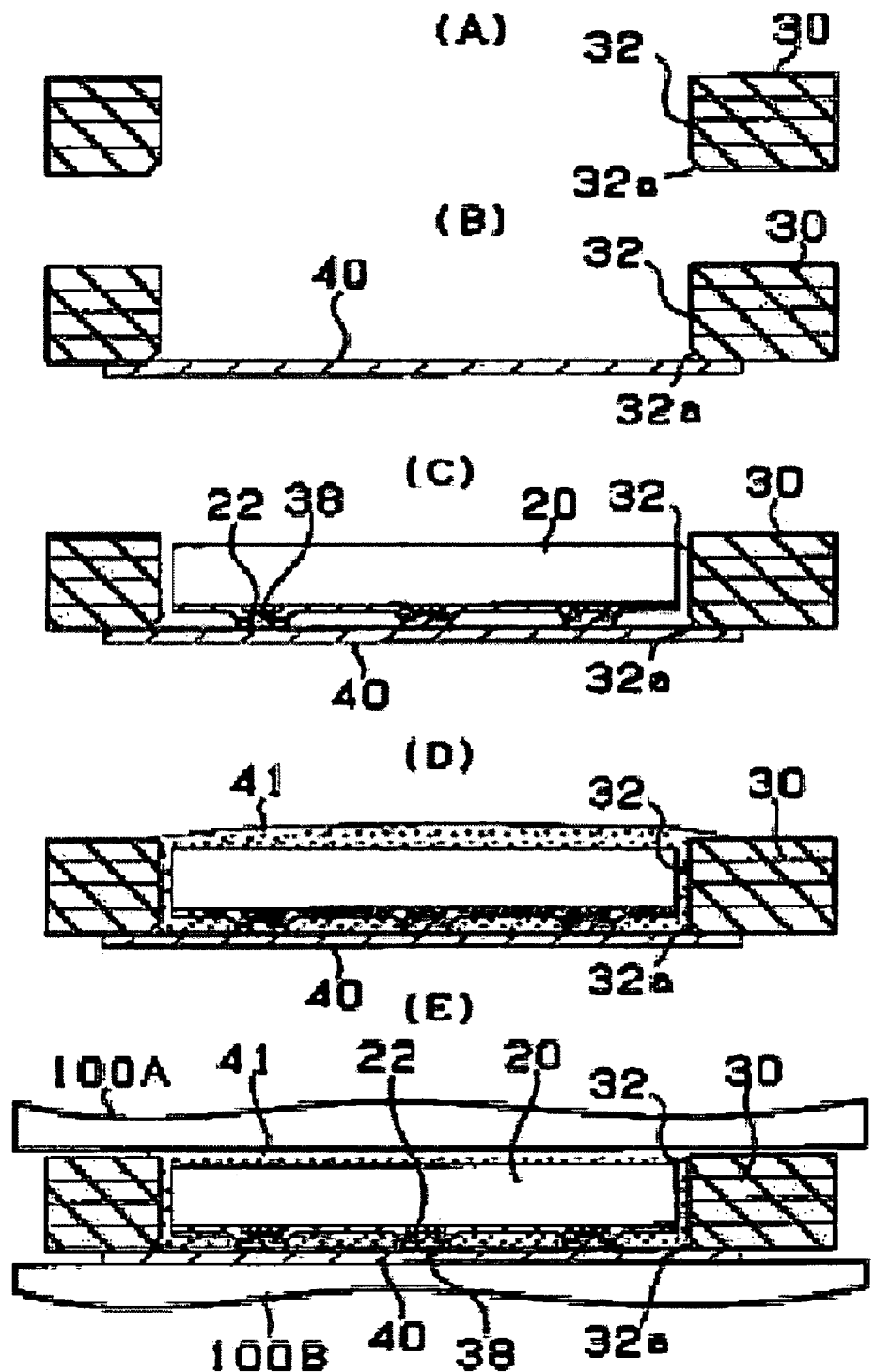
FIG. 1 shows a substrate embedded with a multilayer ceramic condenser in accordance with the prior art.

Hereinafter, a preferred embodiment of the substrate embedded with a passive device and the manufacturing method thereof in accordance with the present invention will be described in detail with reference to the accompanying drawings. In referencing the accompanying drawings, identical elements are given the same reference numerals, regardless of their figure numbers, and any redundant description thereof will be omitted. The substrate described hereinafter includes any substrate for delivering an electrical signal. For example, the substrate in accordance with the present invention can comprise a rigid substrate, a flex substrate, an LTCC substrate, a single-side/multi-side/multilayer substrate and a substrate for packing a semiconductor (e.g. BGA, FBGA and TBGA). In addition, prior to describing the preferred embodiment of the present invention, the general manufacturing process of a flipchip BGA package, which can be applied to a printed circuit board as well as the present invention, will be described first.

First of all, an internal circuit pattern is formed on the outside of a core layer in order to manufacture a printed circuit board. An inner-layer base material that meets the product specification is cut, and a predetermined internal circuit pattern is formed using a dry film and a working film. Here, the inner layer can be scrubbed, an inner layer dry film can be laminated, and the inner layer can be exposed/developed.

Then, prior to bonding the inner layer, on which the circuit pattern is formed, to the outer layer, a brown (black) oxide process is carried out in order to strengthen the adhesion. That is, the surface of a copper foil is chemically oxidized to enhance the surface roughness such that the lamination results in better adhesion. Then, by laminating the inner-layer substrate and a prepreg, prelamination and lamination processes are carried out.

Then, the laminated inner layer substrate and the prepreg are vacuum pressed. It is possible that the laminated inner layer substrate and the prepreg are hot pressed or cool pressed, instead of being vacuum pressed.

The resin and copper foil are trimmed from the corners of the panel, and an X-ray target drilling process, in which a hole is made at a target guide mark on the inner layer circuit, is carried out in preparation of a drilling process.

Then, the drilling process is carried out for electric conduction between the layers of the substrate. Here, a computer numerical control (CNC) method can be used for the drilling process.

Then, the outer layer is coated with the dry film and the working film in order to form a circuit pattern, exposed to a light of a predetermined intensity for a predetermined duration, and the unirradiated areas are developed in an etching process. After examining the outer layer and measuring the scale, a solder resist exposure film is designed and manufactured. Then, a preprocess, such as brush polishing, in which the surface of copper foil is made rough such that the solder resist ink is better adhered to the substrate, is carried out. The solder resist is then coated; the solder resist is exposed using the solder resist exposure film, designed adaptively in the preceding process; the solder resist is removed in a development process; and a variety of postprocesses, including electric/final tests, are carried out.

The general manufacturing process of a flipchip BGA package is as follows:

(a) An aluminum pad is formed on a semiconductor chip and is covered with a protective layer. (b) Through a sputtering process, a metal layer is formed and is connected to the pad. (c) A photo resist is laminated such that only the pad area is open. (d) The pad area, in which the photo resist is open, is lead-plated. (e) The covered photo resist is removed. (f) The metal film outside the lead-plated area is etched off. (g) The plated lead is heated to be made round. (h) A bump chip made through the above steps is spliced to a flipchip BGA substrate. To splice the contact pad of the bump chip with the contact pad of the flipchip BGA substrate, the substrate is heated to a high temperature in a reflow device to melt the lead. Then through an underfill process, resin is filled between the flipchip BGA substrate and the chip.

Figure 2:
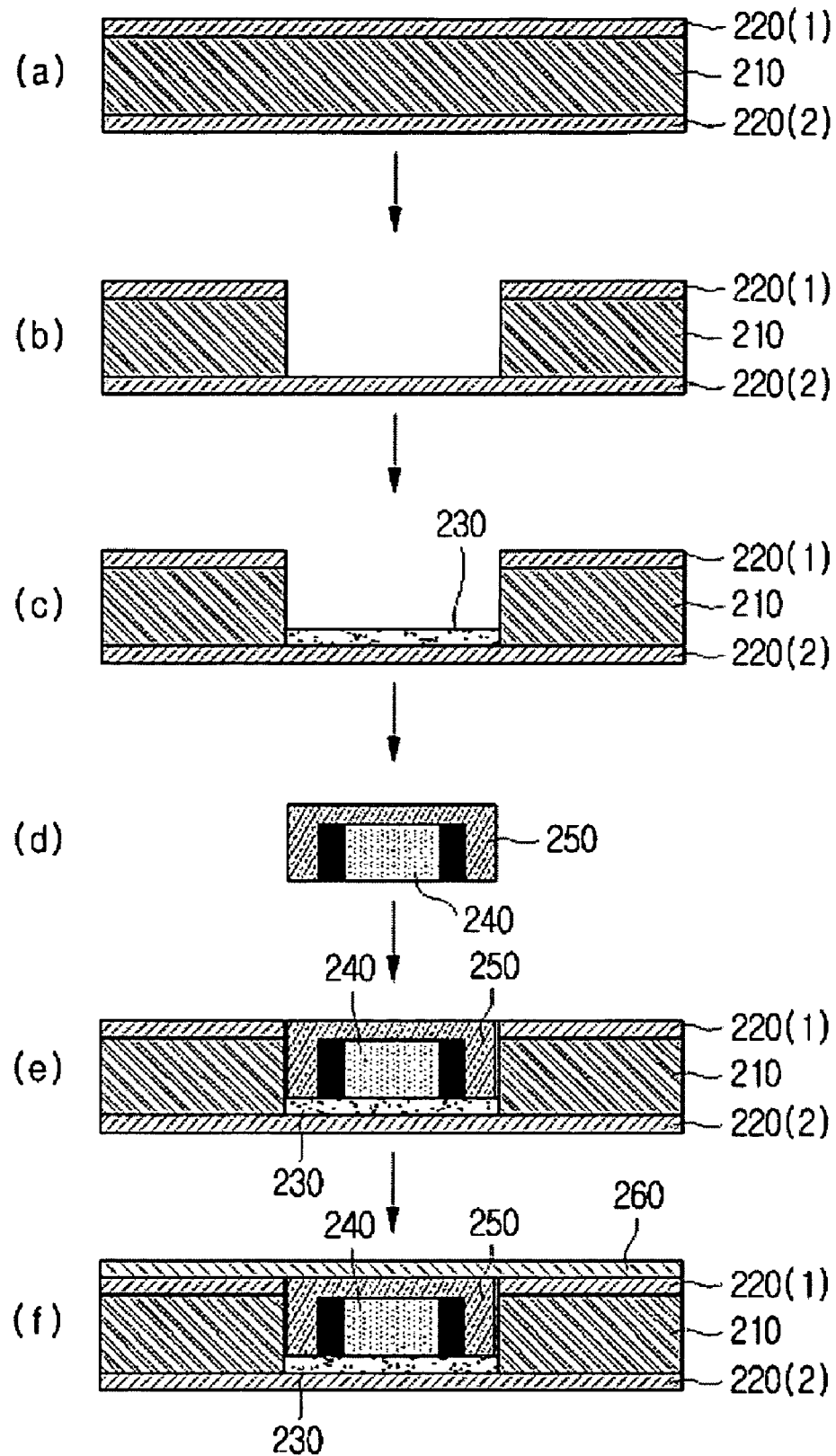
FIG. 2 shows the process of manufacturing a substrate embedded with a passive device, viewed from the side, in accordance with a preferred embodiment of the present invention.
Figure 3:
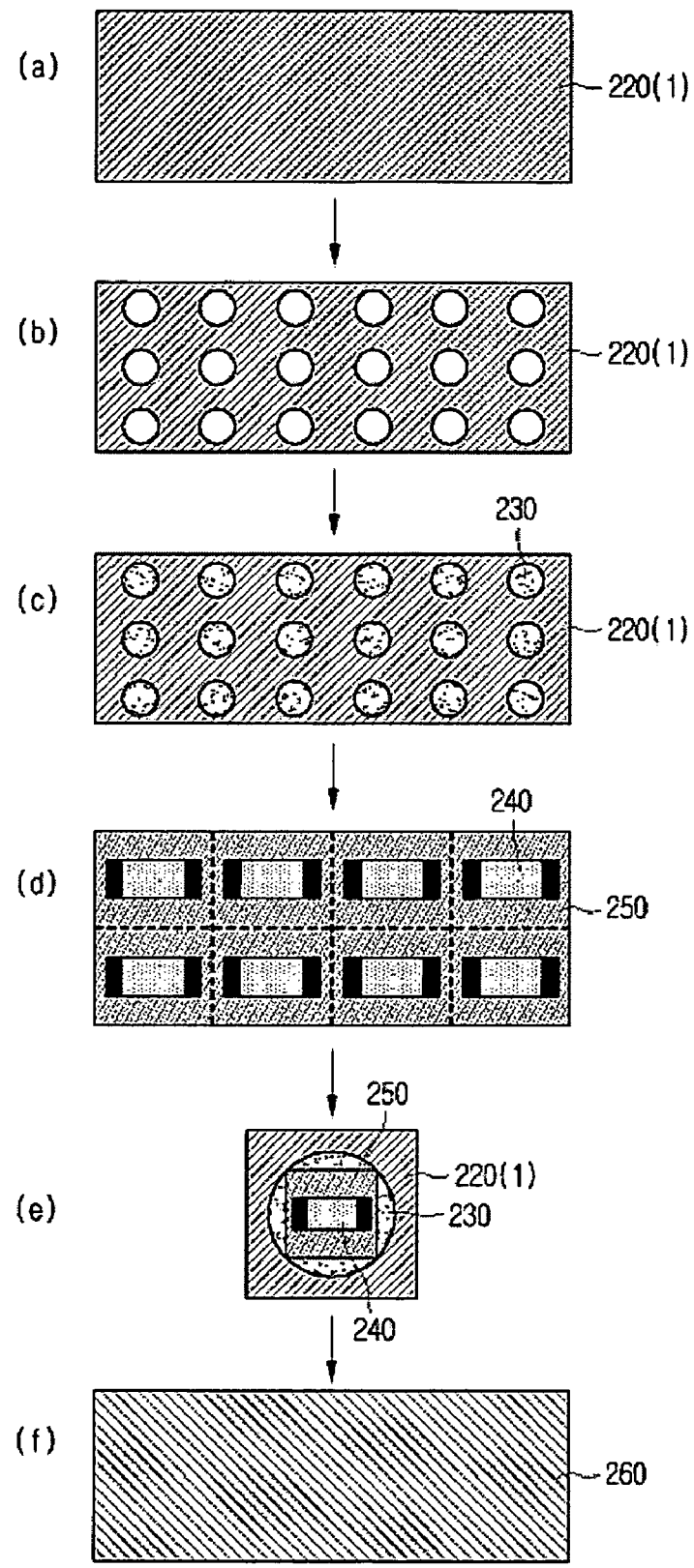
FIG. 3 shows the process of manufacturing a substrate embedded with a passive device, viewed from the top, in accordance with a preferred embodiment of the present invention.

FIG. 2 shows the process of manufacturing a substrate embedded with a passive device, viewed from the side, in accordance with a preferred embodiment of the present invention, and FIG. 3 shows the process of manufacturing a substrate embedded with a passive device, viewed from the top, in accordance with a preferred embodiment of the present invention. Since the identical step identifiers, such as (a), (b), (c) and so on, describe the same process, the description below will be based on the order of process.

Referring to step (a), a copper clad laminate comprises an insulator 210, which is made of a pure epoxy or a mixture of glass and epoxy resin, and copper foil 220(1) and 220(2), which is formed on both sides of the insulator 210. Although a copper clad laminate is described here, the following steps can be also carried out with a single-layer substrate or a multilayer substrate.

Referring to step (b), cavities are formed on the copper clad laminate, using a drill or laser. The drill bit can be of a tungsten alloy.

Referring to step (c), a conductive material 230 is laminated on the cavities formed on the copper clad laminate. The conductive material 230 can be an anisotropic conductive film (ACF) or an anisotropic conductive paste (ACP).

Referring to step (d), pre-molded passive devices are prepared. The passive devices can be a resistance, an inductor or a condenser. Hereinafter, a multilayer ceramic condenser (MLCC), in which a plurality of inner metal and ceramic are stacked, will be described. A plural number of MLCCs 240 can be molded and then separated using, for example, a saw. The molding material 250 can be epoxy resin. In this case, the molding material 250 and the material for the core become the same, thereby inhibiting the warpage caused by the disproportioned properties of the materials. The shape of the passive devices 240 can be hexahedral or cylindrical. The passive devices 240 will be hexahedral if the plurality of passive devices 240 are cut with, for example, as saw. Then, if the corners are polished, the passive devices will become cylindrical.

Referring to step (e), the pre-molded passive devices 240 are mounted on the conductive material 230, which is laminated on the cavities formed on the copper clad laminate. Here, the size of the pre-molded MLCC can be predetermined to fit in the cavities on the CCL.

Referring to step (f), the copper foil 220(1) and 220(2), laminated on the CCL, is patterned to form a circuit and is laminated with a solder resist 250.

Figure 4:
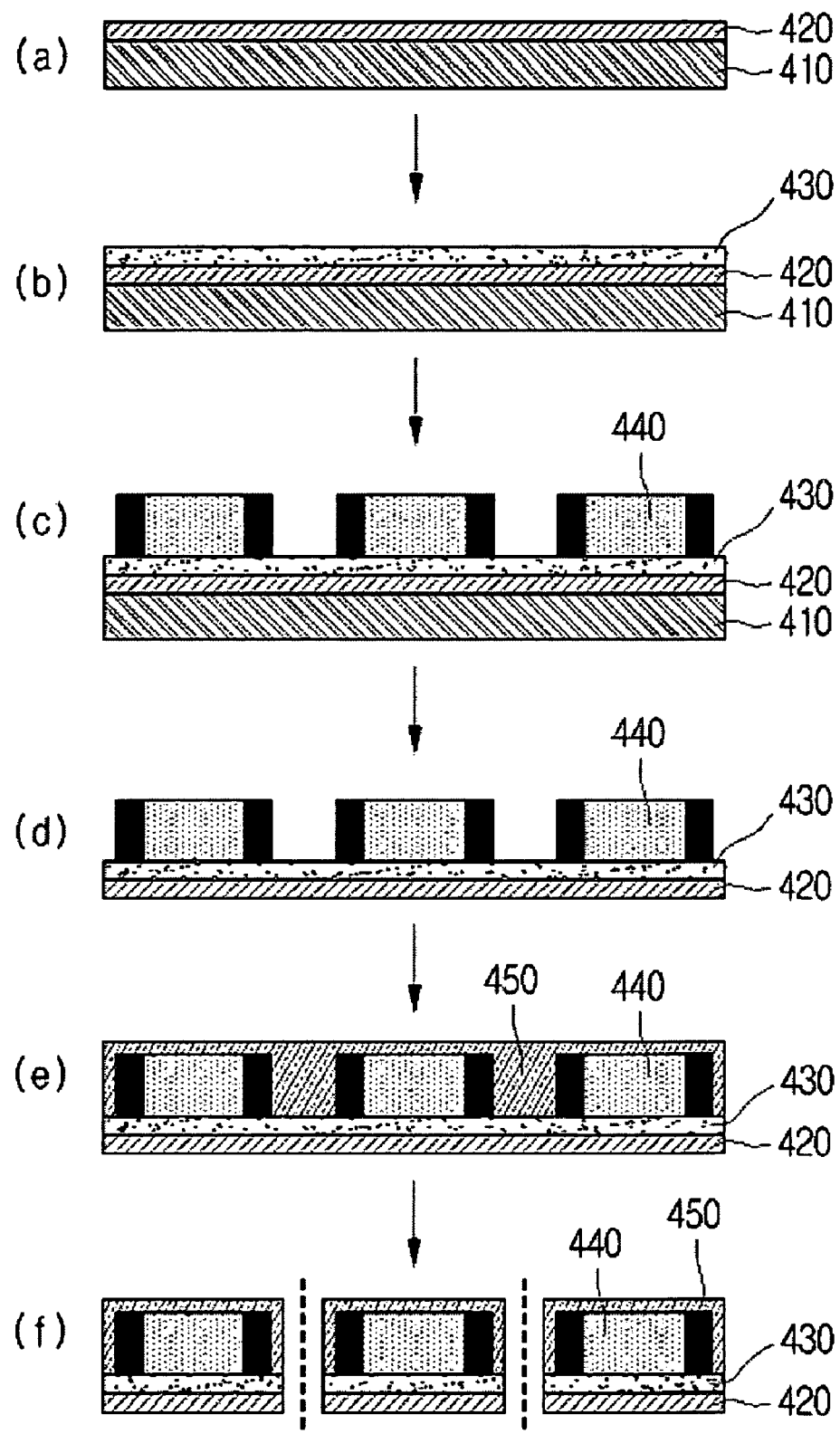
FIG. 4 shows the process of pre-molding the passive device, viewed from the side, in accordance with a preferred embodiment of the present invention.

FIG. 4 shows the process of pre-molding the passive device, viewed from the side, in accordance with a preferred embodiment of the present invention.

Referring to step (a), a circuit 420, patterned in accordance with an electrode formed on the MLCC, is formed on an insulating layer 410.

Referring to step (b), a conductive material 430 is laminated on the circuit 420. The conductive material 430 can be an anisotropic conductive material (e.g. ACF and NCF).

Referring to step (c), at least one MLCC 440 is mounted on the conductive material 430. Referring to step (d), the insulating layer 410, formed on one side of the circuit 420, is removed.

Referring to step (e), the MLCC 440 is molded using epoxy resin 450. Referring to step (f), the molded MLCC is separated using, for example, a saw. The separated MLCC is later mounted on the cavity formed on the substrate.

So far, a general manufacturing process of the substrate embedded with a passive device in accordance with a preferred embodiment of the present invention has been described. Hereinafter, an experimented example of a substrate embedded with a passive device and a manufacturing method thereof in accordance with the present invention will be described with reference to the accompanying drawings. The drawings illustrated hereinafter are simulated by ABAQUS 6.4.1.

Figure 5:
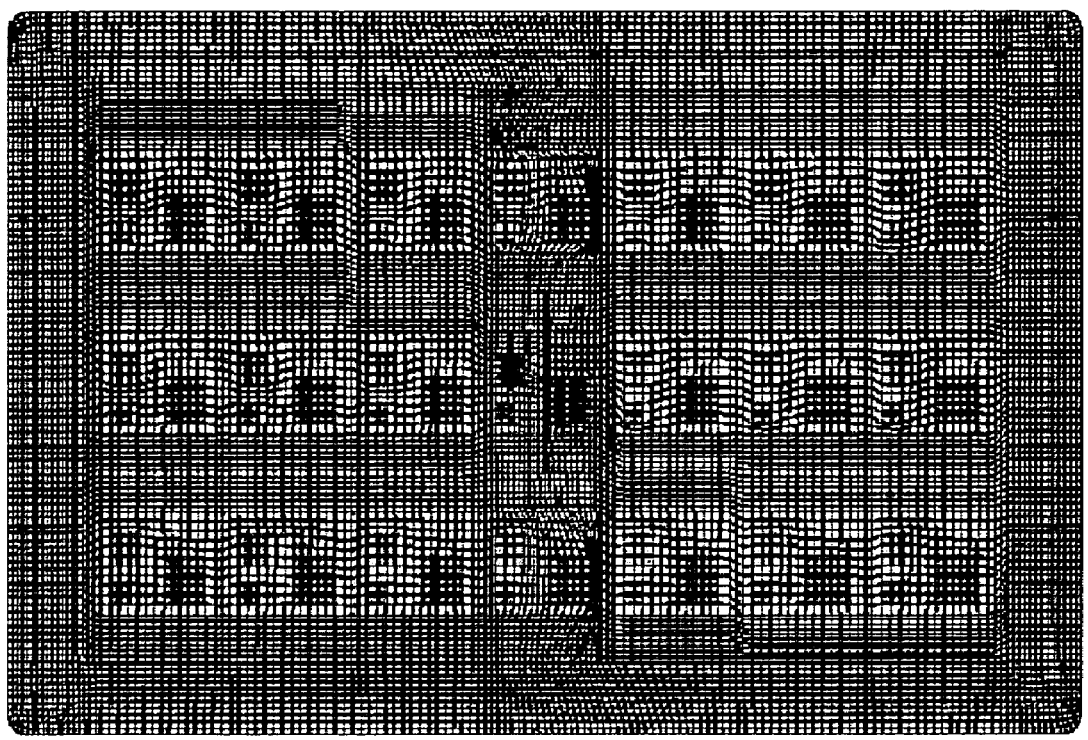
FIG. 5 shows a simulated model for interpreting thermal deformation of the substrate during the manufacturing process of the substrate in accordance with a preferred embodiment of the present invention.
Figure 6:
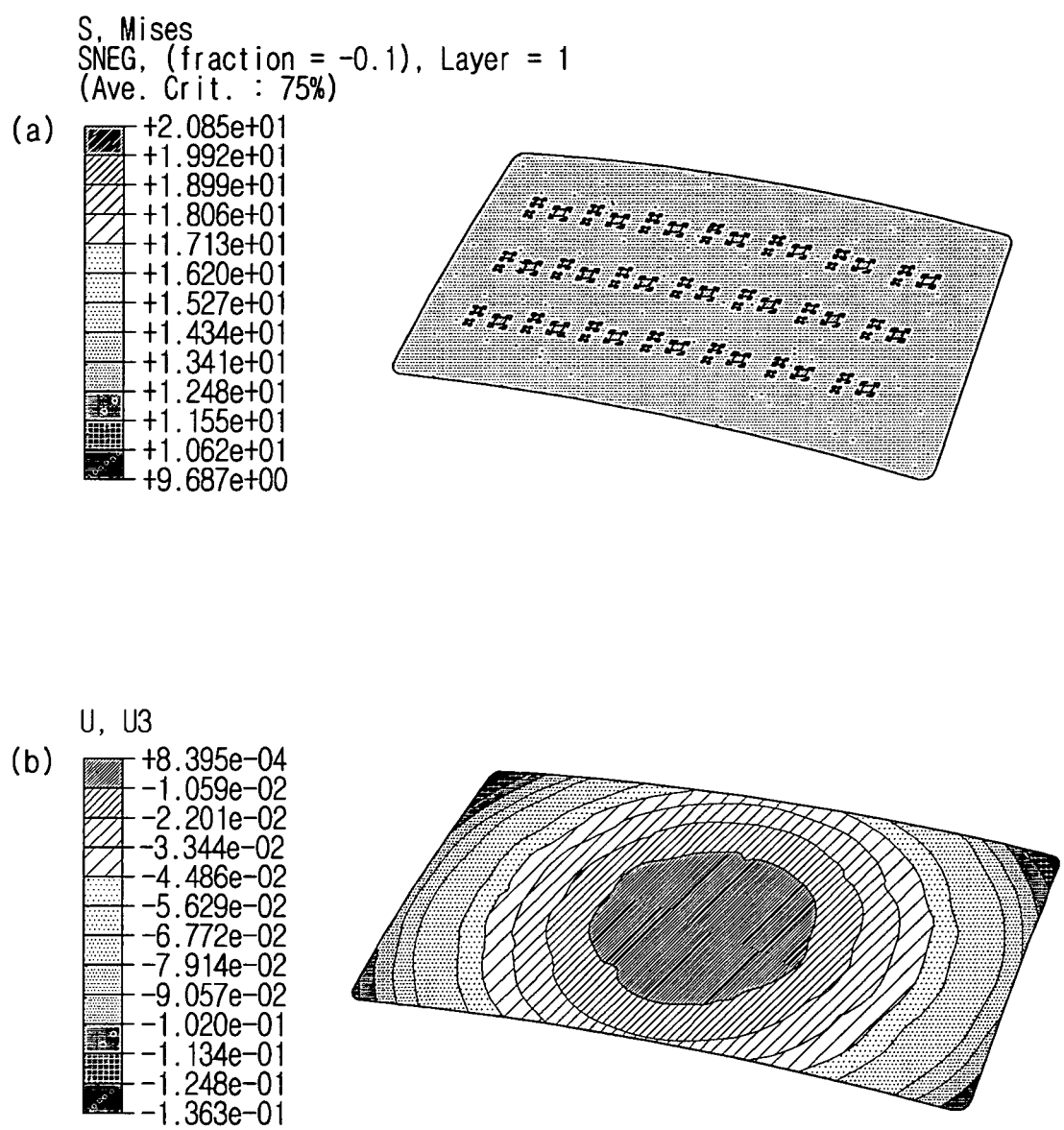
FIG. 6 shows (a) the distribution of thermal stress and (b) distribution of thermal deformation generated from the substrate in accordance with a preferred embodiment of the present invention.

FIG. 5 shows a simulated model for interpreting thermal deformation of the substrate during the manufacturing process of the substrate in accordance with a preferred embodiment of the present invention, and FIG. 6 shows (a) the distribution of thermal stress and (b) distribution of thermal deformation generated from the substrate in accordance with a preferred embodiment of the present invention.

Currently, one of the major technical difficulties of developing an internal MLCC is preventing the MLCC from being damaged by an external load because MLCCs are very vulnerable to an external load.

There can be 3 major conditions that can damage an MLCC. The first condition can occur while inserting the MLCC into the substrate. The second condition is a case of the MLCC being forced to deform due to thermal deformation of the substrate, generated during the manufacturing process of the substrate. The third condition is a case of the substrate being exposed to a shock during, for example, a drop test and delivering a load to the MLCC.

Referring to FIG. 5, a simulated model for interpreting the thermal deformation of the substrate during the manufacturing process of the substrate is illustrated. The areas in which the MLCC is mounted are indicated differently from the rest of the substrate.

Referring to FIG. 6(a), the areas in which the MLCC is mounted have higher thermal stress. Referring to FIG. 6(b), which shows the thermal distribution of the substrate embedded with the MLCC, the amount of warpage from the center is illustrated.

As it can be seen in FIG. 6, the substrate becomes warped in accordance with the temperature, and stress is concentrated where the MLCC is mounted. Therefore, it is important to develop a structure that can alleviate or withstand the stress on the MLCC.

Therefore, the above problem shown in the simulation can be overcome by inserting the MLCC in a molded state, as in the present invention, because the MLCC is protected by the molding.

Moreover, if the molded MLCC is inserted as in the present invention, the warpage that can be generated during the manufacturing process of the substrate can be inhibited because the similar stiffness of the epoxy, which is the material for both the molding and the substrate core, produces an effect of not having the holes made.

As described above, the substrate embedded with passive devices and the manufacturing method thereof can prevent warpage of the substrate caused by disproportioned properties of materials.

With the substrate embedded with passive devices and the manufacturing method thereof, the embedded passive devices are not affected by the substrate warpage.

Moreover, the substrate embedded with passive devices and the manufacturing method thereof can protect the passive devices, if the passive devices are packed in the substrate, by pre-molding the passive devices.

Although a preferred embodiment of the present invention has been described above, anyone of ordinary skill in the art to which the invention pertains should be able to understand that a large number of modifications and permutations are possible within the spirit and scope of the invention and its equivalents, which shall only be defined by the claims, appended below.

What is claimed is:

1. A method for manufacturing a substrate embedded with a passive device, the method comprising:
   preparing a substrate having a cavity formed therein;
   preparing a molded passive device by applying a molding material on the passive device, the molding material being the same as the material of the substrate;
   laminating a conductive material including an anisotropic conductive film (ACF) or an anisotropic conductive paste (ACP) on the cavity; and
   mounting the molded passive device in the cavity,
   wherein the applying the molding material on the passive device comprises
      forming a patterned circuit on an insulating layer in accordance with an electrode formed in the passive device;
      laminating a conductive material including an anisotropic conductive film (ACF) or an anisotropic conductive paste (ACP) on the circuit;
      mounting the passive device on the conductive material;
      removing the insulating layer; and
      applying the molding material on the passive device.

2. The method of claim 1, wherein a plurality of passive devices are mounted on the conductive material, and
   the method further comprises separating the molded passive devices from each other after applying the molding material on the passive device.

3. The method of claim 1, wherein the passive device is any one from a group consisting of a resistance, an inductor and a condenser.

4. The method of claim 3, wherein the condenser is a multilayer ceramic condenser.

5. The method of claim 2, wherein the material molding the passive device in applying the molding material is an epoxy resin.

6. The method of claim 2, wherein, in separating the passive device, the passive device is separated in a hexahedral shape, using a saw.

7. The method of claim 2, wherein, in separating the passive device, the passive device is separated in a cylindrical shape.

* * * * *